United States Patent [19]

Kubota et al.

[11] Patent Number: 4,805,174

[45] Date of Patent: Feb. 14, 1989

[54] ERROR CORRECTING CODER/DECODER

[75] Inventors: Shuji Kubota; Shuzo Kato, both of Yokohama, Japan

[73] Assignee: Nippon Telegraph and Telephone Corporation, Tokyo, Japan

[21] Appl. No.: 947,328

[22] Filed: Dec. 29, 1986

[30] Foreign Application Priority Data

Dec. 25, 1985 [JP] Japan .................................. 60-296268

[51] Int. Cl.⁴ ............................................ G06F 11/10
[52] U.S. Cl. ..................................................... 371/43
[58] Field of Search ........................ 371/37, 43, 44, 45, 371/41

[56] References Cited

U.S. PATENT DOCUMENTS 4,500,994 2/1985 McCallister ............................ 371/43
4,669,084 5/1987 Hartman ................................ 371/43

FOREIGN PATENT DOCUMENTS 2095517 9/1982 United Kingdom .................. 371/43

Primary Examiner—Jerry Smith
Assistant Examiner—Robert W. Beausoliel
Attorney, Agent, or Firm—Cushman, Darby & Cushman

[57] ABSTRACT

This invention relates to a convolutional encoder which encodes original data into convolutional codes by using a multinomial from which predetermined terms of the generation multinomial for generating the original convolutional codes are eliminated to thereby achieve high transmission efficiency as well as high error correcting capacity. The maximum likelihood decoder which is provided on the receiver side to correspond to the encoder can decode in maximum likelihood by calculating the branch metrics of received encoded data and decode the original data in correspondence to the coding rate of the original data with those branch metrics.

6 Claims, 11 Drawing Sheets

Maximum Likelihood Decoder

First Embodiment

Trellis Diagram

Time-chart

Time Chart

Trellis Diagram

Viterbi Decoder

Convolutional Encoder

Prior Art

Convolutional Encoder

Receiver Side

Characteristics for the Second Embodiment

ERROR CORRECTING CODER/DECODER

FIELD OF THE INVENTION

This invention relates to data communications using digital signals, and more particularly to an error correcting coder/decoder which encodes a data sequence into convolutional codes when transmitting and decodes them by maximum likelihood decoding when receiving.

BACKGROUND OF THE INVENTION

In the prior art communications of a data sequence using digital signals, error correcting is generally employed to correct errors caused by noise on the transmission channel by encoding the data sequence into error correcting codes when transmitting and decoding the data sequence when receiving by a scheme corresponding to the above mentioned encoding. Among the various encoding and decoding methods used in such a device, convolutional encoding and maximum likelihood decoding methods have been known as excellent methods.

A convolutional encoder having the coding rate: $k_0/n_1 = 3/6 = \kappa$, and the constraint length $k = 3$ is exemplified in the following explanation. The coding rate means the rate of the number of bits of an input data sequence against the number of bits in a corresponding code sequence. In other words, the larger the coding rate means, the smaller the redundancy. The constraint length means the number of bits in an input data necessary to obtain an output code. In the case where the constraint length k is 3, an output code is obtained based upon an input data and two registered data.

FIG. 8 is a block diagram to show a prior art convolutional encoder wherein a data sequence D which is expressed by $D=(D_0, D_1, D_2, D_3, D_4 \ldots$ is inputted at an input terminal 1. $D_0, D_1, D_2 \ldots$ denote respectively input bits at times $t=0, 1, 2\ldots$ A shift register 317 comprises three bits $d_0, d_1, d_2$, and sequentially shifts and stores data sequence D. In other words, a data $D_t$ which is inputted at the time t at the input terminal 1, is stored at the bit $d_0$ of the shift register 317 and is consecutively shifted to bits $d_l$ and $d_2$ at the time $t+1$, and time $t+2$. The data stored at the bits $d_0$ and $d_2$ are calculated for exclusive OR by a modulo-2 adder and sent out to a transmission path from an output terminal 40 as an I channel code. The data stored at the bits $d_0$, $d_1$ and $d_2$ are calculated for exclusive OR and sent out to a transmission path from an output terminal 41 as a Q channel code.

In short, code sequences I and Q $$I=(I_0, I_1, I_2 \ldots)$$

$$Q=(Q_0, Q_1, Q_2 \ldots)$$

are outputted from the output terminals 40 and 41 after the time $t=2$. Herein, $$I_t = D_t + D_{t+2}$$

$$Q_t = D_t + D_{t+1} + D_{t+2}$$

$t = 0, 1, 2 \ldots$

[+] denotes an addition by a modulo-2 adder. The symbol [+] hereinafter denotes an addition by a modulo-2 adder.

FIG. 9 is a trellis diagram of the convolutional encoder as above described.

The state $(d_0, d_1)$ indicates the content of the bits $d_0$, $d_1$ of the shift register 317 immediately before the input of an original data $D_t$. Solid lines denote a state transition when $D_t = 0$, and broken lines a state transition when $D_t = 1$. The figures written near the lines denote respective outputs $(I_t, Q_t)$ The table below indicates outputs $(I_t, Q_t)$ in correspondence to the states $(d_0, d_1)$.

TABLE

|         | $d_0 d_1$ | $I_t$ | $Q_t$ |
|---------|-----------|-------|-------|
| $D_t = 0$ | 0 0       | 0     | 0     |
|         | 1 0       | 0     | 1     |
|         | 0 1       | 1     | 1     |
|         | 1 1       | 1     | 0     |
| $D_t = 1$ | 0 0       | 1     | 1     |
|         | 1 0       | 1     | 0     |
|         | 0 1       | 0     | 0     |
|         | 1 1       | 0     | 1     |

A case where the shift register is $(d_0, d_1) = (1, 0)$ will be exemplified for a descriptive purpose. When an input $D_t$ is [0], the output will be $I_t=0, Q_t=1$ and the shift register 317 will have the state $(d_0, d_1) = (0, 1)$.

When the data $D_t$ is [1], the output will be $I_t=1, Q_t=0$ and the shift register 317 will assume the state $(d_0, d_1) = (1, 1)$.

The output from a convolutional decoder is transmitted through a transmission path and decoded by a maximum likelihood decoder. As the maximum likelihood decoder, a Viterbi decoder using Viterbi algorithm is generally used as it can execute estimations of the original data at a high efficiency. The Viterbi decoder decodes input data by seeking a path (history of state transistion) having the highest correlation or in other words having the smallest summing distance in respect of the received encoded data and estimating the original data based thereon.

FIG. 10 is a block diagram to show a conventional Viterbi decoder. A Viterbi decoder for a 3 bit soft decision is exemplified here for illustration purposes.

Incoming codes of I and Q channels via a transmission channel are quantized in soft-decision in respective 3 bits or 8 values and inputted at input terminals 70, 71 of the Viterbi decoder. A branch metric calculator 73 calculates correlation of a branch metric between input signals and state transitions in correspondence to the trellis diagram shown in FIG. 9. A path metric calculator 75 adds the output from the branch metric calculator 73 and the old path metric and calculates a new path metric. A path memory 76 stores history of a path which corresponds to the path metric. A final decision circuit 77 decides the final decoded output and outputs it to an output terminal 9.

FIG. 11 is a block diagram to show another prior art convolution encoder. This convolutional encoder is an encoder equivalent to the above prior art encoder comprising a serial/parallel converter 30, shift registers of 2 bits 31, 32, 33, modulo-2 adders 34, 35, 36, 37, 42, 43 and a parallel/parallel converter 44.

A data sequence inputted at an input terminal 1 is distributed into three sequences of data by the serial/- parallel converter 30 and respectively inputted at shift registers 31, 32, and 33. The outputs of the modulo-2 adders 34, 35, 42, 36, 37 and 43 are respectively expressed in equations below;

$$K_1 = D_t \quad\quad\quad + D_{t+2}$$
$$K_2 = D_t + D_{t+1} + D_{t+2}$$
$$K_3 = \quad\quad D_{t+1} \quad\quad + D_{t+3}$$
$$K_4 = \quad\quad D_{t+1} + D_{t+2} + D_{t+3}$$
$$K_5 = \quad\quad\quad D_{t+2} \quad\quad + D_{t+4}$$
$$K_6 = \quad\quad\quad D_{t+2} + D_{t+3} + D_{t+4}$$

The parallel/parallel converter 44 converts these codes in 6 sequences into the codes of 2 sequences, and outputs respectively I and Q channel codes to the output terminals 40, 41 in a manner expressed below;

$$K_I = (K_1, K_3, K_5)$$

$$K_Q = (K_2, K_4, K_6)$$

FIG. 12 is a block diagram to show still another convolutional encoder which has the coding rate of $K_0/n_1 = 7/14 = \frac{1}{2}$, and the constraint length of $k=7$.

An input terminal 1 is connected to a shift register 318 of 7 bits. The first, third, fourth, sixth and seventh bits counting from the side of the input terminal 1 are connected to a modulo-2 adder 330. Similarly, the first, second, third, fourth and seventh bits are connected to a modulo-2 adder 331. The modulo-2 adder 330 is connected to an output terminal 40 to output one channel codes. The modulo-2 adder 331 is connected to an output terminal 41 to output Q channel codes.

In other words, I an Q channel codes are outputted at the output terminals 40, 41 in the manner expressed below;

$$I_t = D_t + D_{t+1} + D_{t+3} + D_{t+4} + D_{t+6}$$

$$Q_t = D_t + D_{t+3} + D_{t+4} + D_{t+5} + D_{t+6}$$

In the error correcting code method with convolutional coding and maximum likelihood decoding, the larger the redundancy of the code sequence, the greater becomes the correcting capacity similarly with other error correcting methods. But redundancy should preferably be limited in order to increase transmission efficiency. There has been proposed a punctured coding-/Viterbi decoding method as a method which is capable of minimizing redundancy or maximizing transmission efficiency and which still is capable of realizing a greater error correcting capacity. (The method is referred to simply as a punctured method hereinafter.)

FIG. 13 is a block diagram to show an error correcting coder/decoder of the punctured method. The transmission side of this decoder comprises an input terminal 1, a convolutional encoder 10, a symbol stealing circuit 11 and a symbol stealing map memory 12, and is connected to the receiver side via a transmission channel 5. The convolutional encoder 10 is a prior art decoder as described above.

Data to be transmitted is inputted at an input terminal 1. The convolutional encoder 10 conducts convolutional encoding of the coding rate R and outputs the convolutional codes. The symbol stealing circuit 11 processes these convolutional codes for conversion into a speed corresponding to the stealing of code symbols and the stealing patterns thereof. The stealing patterns to be used by the symbol stealing circuit 11 are stored by the symbol stealing map memory 12 in advance. The speed conversion process is executed by using, for instance, intermittent clocks. The symbol stealing circuit 11 outputs transmission codes having a coding rate R which is larger than the coding rate R to the transmission path 5.

The receiver side includes a dummy symbol insertion circuit 13, an insertion map memory 14, a maximum likelihood decoder 15 and an output terminal 9.

The dummy symbol insertion circuit 13 inserts dummy symbols into a received transmission code in accordance with the dummy symbol insertion pattern from the insertion map memory 14 to return the mode and the code speed to those of the convolutional codes. The maximum likelihood decoder 15 decodes the output from the dummy symbol insertion code.

FIG. 14 is a block diagram to show the essential components of the circuit on the receiver side. A received signal input terminal 130 receives as input the data from the transmission channel 5 while a synchronization signal input terminal 16 receives as input the code synchronization signals.

The dummy symbol insertion circuit 13 includes a speed converter 131 and a dummy symbol insertion memory 132. The converter 131 converts the speed of received data with speed conversion clocks such as the intermittent clocks which are based on the code synchronization signals. The dummy symbol map memory 132 inserts dummy symbols into the received data whose speed have been converted in accordance with the dummy symbol insertion fed pattern fed from the insertion map memory 14. This produces codes of the same mode as convolutional codes which are subsequently inputted at the maximum likelihood decoder 15.

The maximum likelihood decoder 15 includes a branch metric calculator 73, a path metric calculator 75, a path metric memory circuit 76 and a final decision circuit 77. The branch metric calculator 73 calculates the branch metric out of the output from the dummy symbol insertion circuit 13. The inserted dummy symbols are forcibly given the branch metric in accordance with metric calculation inhibit pulse from the insertion map memory 14 in such a manner that the received symbol becomes a value intermediate between [0] and [1]. The path metric calculator 75, the path metric circuit 76 and the final decision circuit 77 decode the branch metric outputted from the branch metric calculator 73 into original data in accordance with the Viterbi algorithm. The decoded data are outputted to the output terminal 9.

The above mentioned prior art devices are known from the following references:
(1) Japanese Patent Application Laid-open Sho 57 - 155857
(2) JIECE J64- B Vol. 7 (July, 1981), pp. 573
(3) Proc. 6th International Conference on Digital Satelite Communications, Phoenix, Sept. 1983, XII 24–XII 31
(4) IEEE Trans. COMMUN Vol. COM-32, NO. 3, March 1984, pp. 315–319
(5) IEEE Trans. COMMUN Vol. COM-19, No. 5, Oct. 1971, pp. 751–772

The prior art error correction code decoding device of punctured method, however, inconveniently needs a symbol stealing map memory and a symbol stealing circuit in addition to a convolutional encoder. Moreover, the device further needs to conduct timing control with intermittent clocks in order to conduct the speed conversion as well as stealing of symbols. The receiver side thereof needs a dummy symbol insertion circuit and an insertion map memory in addition to a maximum likelihood decoder corresponding to the convolutional encoder. The receiver side further needs a control in timing intermittent clocks which are required for the speed conversion as well as for insertion of dummy symbols. The prior art device therefore becomes large with respect to circuit scale and complicated in control.

The invention aims at providing an error correcting coder/decoder which can realize maximum likelihood decoding at high efficiency as well as with a high gain but without symbol stealing and dummy symbol insertion which were heretofore required in the punctured method.

SUMMARY OF THE INVENTION

The error correcting code decoder according to the present invention comprises a convolutional encoder which is provided for transmission to convolutionally encode the input data and a maximum likelihood decoder which is provided for reception to calculate the metric of received code data and estimate the original data transmitted. This invention is characterized in that the convolutional encoder includes a means to generate convolutional codes of the coding rate of $k_0/n_0$ ($n_0$ is a natural number having the relation $k_0<n_0<n_1$) in the multinomial for generating a convolutional code of the coding rate $k_0/n_1$ ($k_0$ and $n_1$ are natural numbers) which is removed of a predetermined term, and the maximum likelihood decoder includes a means to conduct maximum likelihood decoding in correspondence with the coding rate of $k_0/n_1$ by calculating the metrics in the number of $k_0$ out of the received code data of $n_0$ bits.

Provided that $k_0$ denotes the number of bits in the original data, $n_1$ the number of bits according to the prior art method, and $n_0$ the number of bits according to this invention method.

This invention convolutional encoder comprises a serial/parallel converter which distributes the input original data sequences into the sequences in the number of $k_0$, shift registers in the number of $k_0$ which store the output from said serial/parallel converter, and modulo-2 adders in the number of $n_0$ which generate convolutional codes out of the data stored by these shift registers in accordance with a multinomial for generation of codes.

The maximum likelihood decoder comprises a branch metric calculator which calculates the metrics in the number of $k_0$ out of the transmission path codes of $n_0$ bits which are received in time series, a speed converter which converts the output from said branch metric calculator into the signal speed of the original data and a means to estimate the original data in correspondence with the coding rate of $k_0/n_1$.

This invention error correcting coder/decoder encodes by using a generation multinomial for convolutional codes in correspondence with the maximum likelihood decoder to be used in the receiver side which are removed of predetermined terms which can be omitted without significantly influencing the efficiency of error correcting. This invention can be constructed with simple hardware, needs no complicated timing control, and yet can achieve effects in transmission and error correction which are similar to the prior art punctured method.

DETAILED DESCRIPTION OF THE PREFERRED EMBODIMENTS

Figure 1:
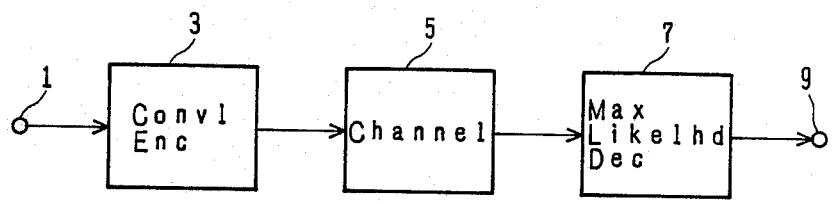
FIG. 1 is a block diagram which shows a first embodiment of an error correcting coder/decoder according to this invention.

FIG. 1 is a block diagram of an embodiment of the invention.

An input terminal 1 is connected to a convolutional encoder 3 which is connected to a maximum likelihood decoder 7 via a transmission channel 5. The maximum likelihood decoder 7 is connected to an output terminal 9.

The convolutional encoder 3 is different from the prior art encoders in that the codes are generated in the generation polynomial from which predetermined terms are omitted. The codes generated with a generation multinomial from which no terms are omitted will be referred to as "original convolutional codes" hereinafter. The maximum likelihood decoder 7 decodes the codes received, for instance, with Viterbi algorithm in correspondence with the output from the convolutional encoder 3 in order to output data sequences in a manner corresponding to the data sequence inputted on the transmission side.

Description will now be given to the first embodiment of the invention comprising a convolutional encoder 3 and a maximum likelihood decoder 7 corresponding thereto having the coding rate of the original convolutional codes: $k_0/n_1 = 3/6 = \frac{1}{2}$, the constraint length: $k=3$, and
the coding rate on the transmission channel 5: $k_0/n_0 = \frac{3}{4}$.

The MODEM method on the transmission path 5 is a 4-phase shift keying modulation method wherein signals are demodulated with 3 bits (8 digits) soft-decision on the receiver side before maximum likelihood decoding.

Figure 2:
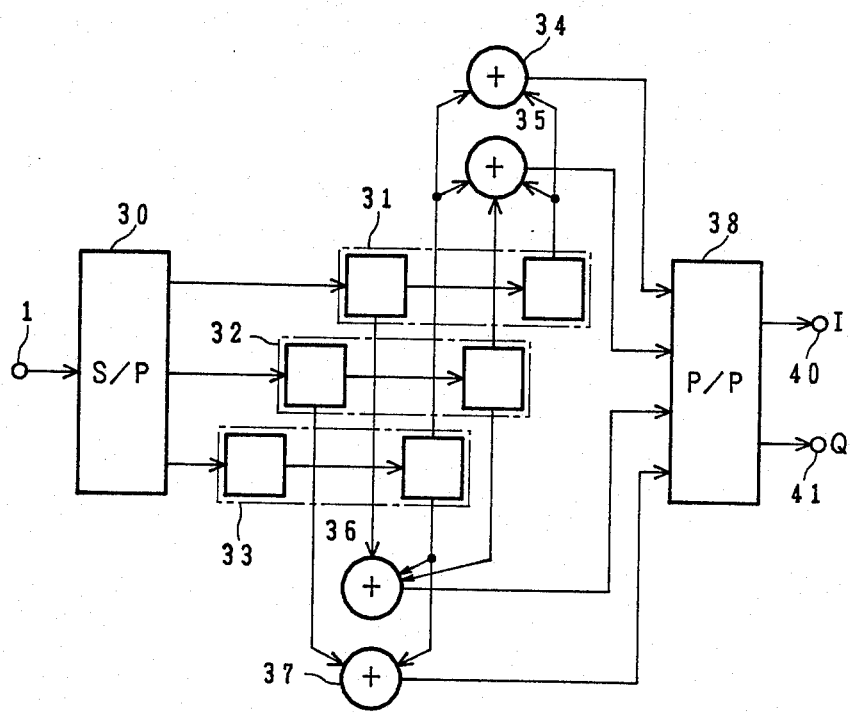
FIG. 2 is a block diagram of a convolutional encoder used in the first embodiment of this invention.

FIG. 2 is a block diagram to show the details of the convolutional encoder 3 in the first embodiment of this invention.

An input terminal 1 is connected to a serial/parallel converter 30 which is connected to shift registers 31, 32 and 33 of a two bit construction.

The first bit of the shift register 31 is connected to a modulo-2 adder 36, the second bit thereof to modulo-2 adders 34 and 35. The first bit of the shift register 32 is connected to a modulo adder 37, the second bit thereof to modulo-2 adders 35 and 36. The second bit of the shift register 33 is connected to modulo-2 adders 34, 35, 36 and 37. The first bit as used herein means the bit which directly receives data from the serial/parallel converter 30, while the second bit means the bit which receives the data from the first bit.

The outputs from the modulo-2 adders 34, 35, 36 and 37 are connected to a parallel/parallel converter 38. The I and Q channel outputs of the parallel/parallel converter 38 are connected to output terminals 40, 41.

It is assumed that the original data sequence D inputted at the converter 38 is expressed as $$D = (D_0, D_1, D_2, D_3, D_4 \ldots)$$

$D_t$ denotes the original data at the time t.

The modulo-2 adders 34, 35, 36 and 37 generate at this time, respectively, the convolutional codes as follows:

$$T1 = D_0 \phantom{+ D_1} + D_2$$
$$T2 = D_0 + D_1 + D_2$$
$$T3 = \phantom{D_0 +} D_1 + D_2 + D_3$$
$$T4 = \phantom{D_0 + D_1 +} D_2 \phantom{+} D_4$$

The symbol [+] denotes addition by a modulo-2. At the time the shift registers are shifted by one bit, they generate convolutional codes as follows:

$$T1' = D_3 \phantom{+ D_4} + D_5$$
$$T2' = D_3 + D_4 + D_5$$
$$T3' = \phantom{D_3 +} D_4 + D_5 + D_6$$
$$T4' = \phantom{D_3 + D_4 +} D_5 \phantom{+} + D_7$$

These convolutional codes are converted in 4 - 2 parallel/parallel by a parallel/parallel converter 38, and outputted respectively from the output terminals 40, 41 in two sequences.

$$I = (T1, T3, T1', T3', \ldots)$$

$$Q = (T2, T4, T2', T4', \ldots)$$

Figure 11:
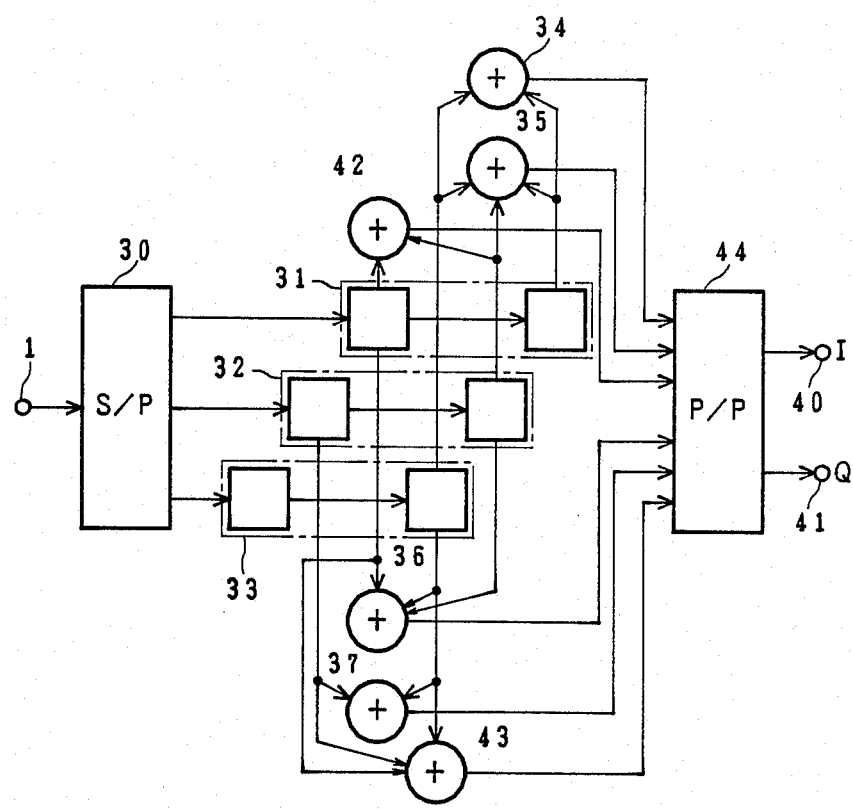
FIG. 11 is a block diagram of a second prior art convolutional encoder.

The convolutional encoder 3 according to this invention corresponds to the prior art convolutional encoder shown in FIG. 11, but generates the following sequences instead of generating $I_1, Q_2, I_4, Q_5 \ldots$ $$I = (I_0, Q_1, I_3, Q_4, \ldots I_{3n}, Q_{3n+1}, \ldots)$$

$$Q = (Q_0, I_2, Q_3, I_5, \ldots Q_{3n}, I_{3n+2}, \ldots)$$

Figure 3:
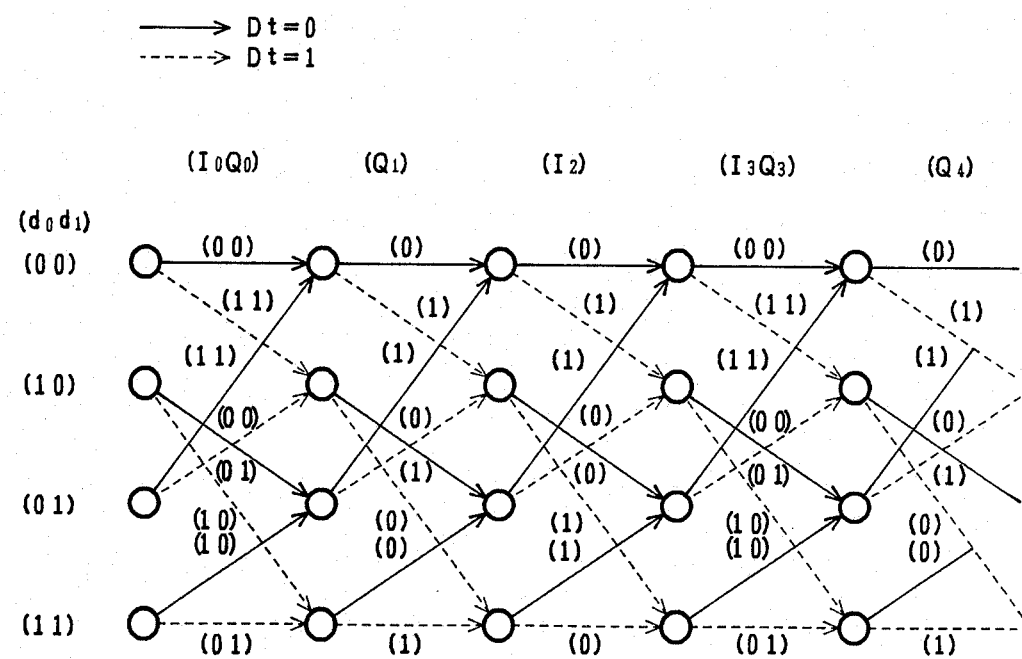
FIG. 3 is a trellis diagram of the convolutional encoder of FIG. 2.

FIG. 3 shows a trellis diagram thereof.

Compared to the prior art shown in FIG. 11, this invention does not include modulo-2 adders 42, 43. As a result, the coding rate R' on the transmission path 5 becomes ¾. The codes are selected in a manner to minimize the deterioration of the error correcting effect which will be caused from the omission.

The convolutional codes thus generated are shift-keying modulated in 4-phase as I and Q channel signals, and are transmitted to the receiver side via the transmission channel 5. On the receiver side, the received signals which are often mixed with noise on the path 5 are quantized respectively in I and Q channels with 3 bit (8 digit) soft decision signals, and are inputted at the maximum likelihood decoder 7 together with code synchronization signals. The code synchronization signals are assumed to be 2 bit signals herein, and accordingly, signals in 8 bits in total are inputted at the maximum likelihood decoder 7.

Figure 4:
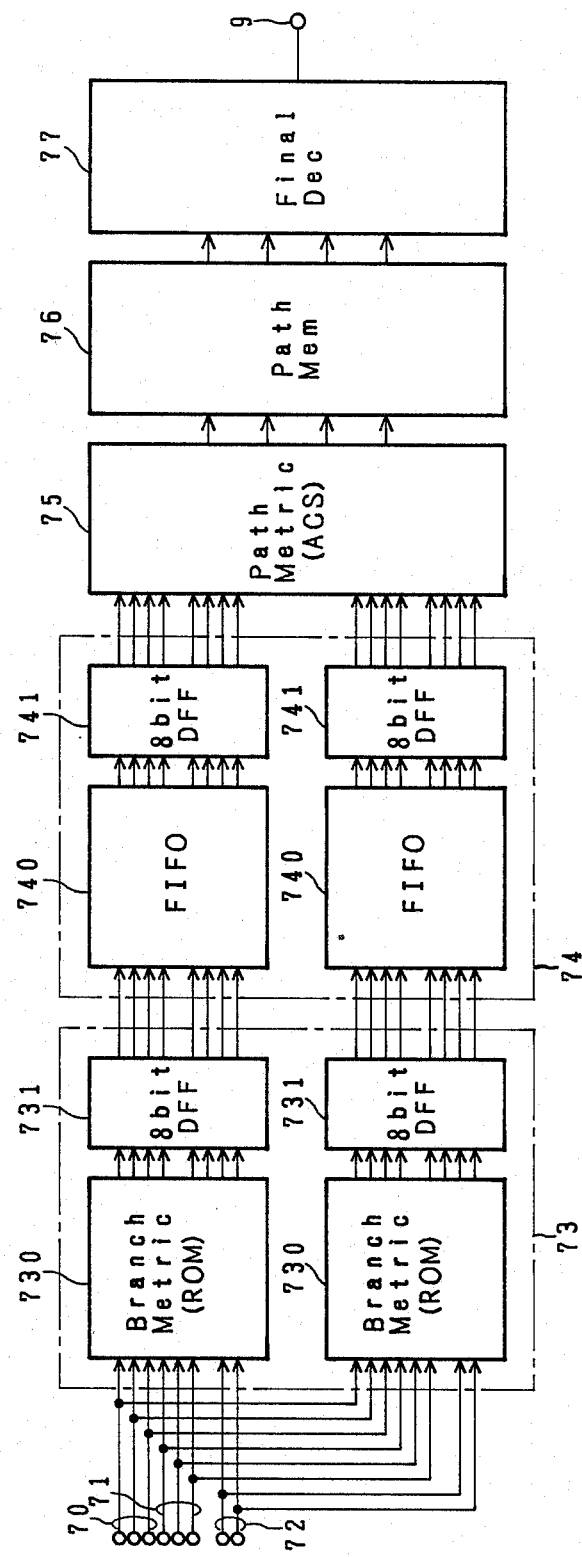
FIG. 4 is a block diagram of a maximum likelihood decoder used in the first embodiment of this invention.

FIG. 4 shows a block diagram of a maximum likelihood decoder which decodes those codes.

Input terminals 70, 71, and 72 are connected to a ROM 730 for branch metric calculation. The ROM 730 is connected to a D flip flop 731. The ROM 730 and the D flip flop 731 form a branch metric calculation circuit 73. The D flip flop 731 is connected to a FIFO (first-in first-out) memory 740 for speed conversion. The FIFO memory 740 is connected to a D flip flop 741. The FIFO memory 740 and D flip flop 741 form a speed conversion circuit 74. The D flip flop 741 is connected to a path metric calculator 75. The path metric calculator 75 is connected to a path memory 76 which is connected to a decoder output decision circuit 77. The circuit 77 is connected to an output terminal 9.

Figure 5:
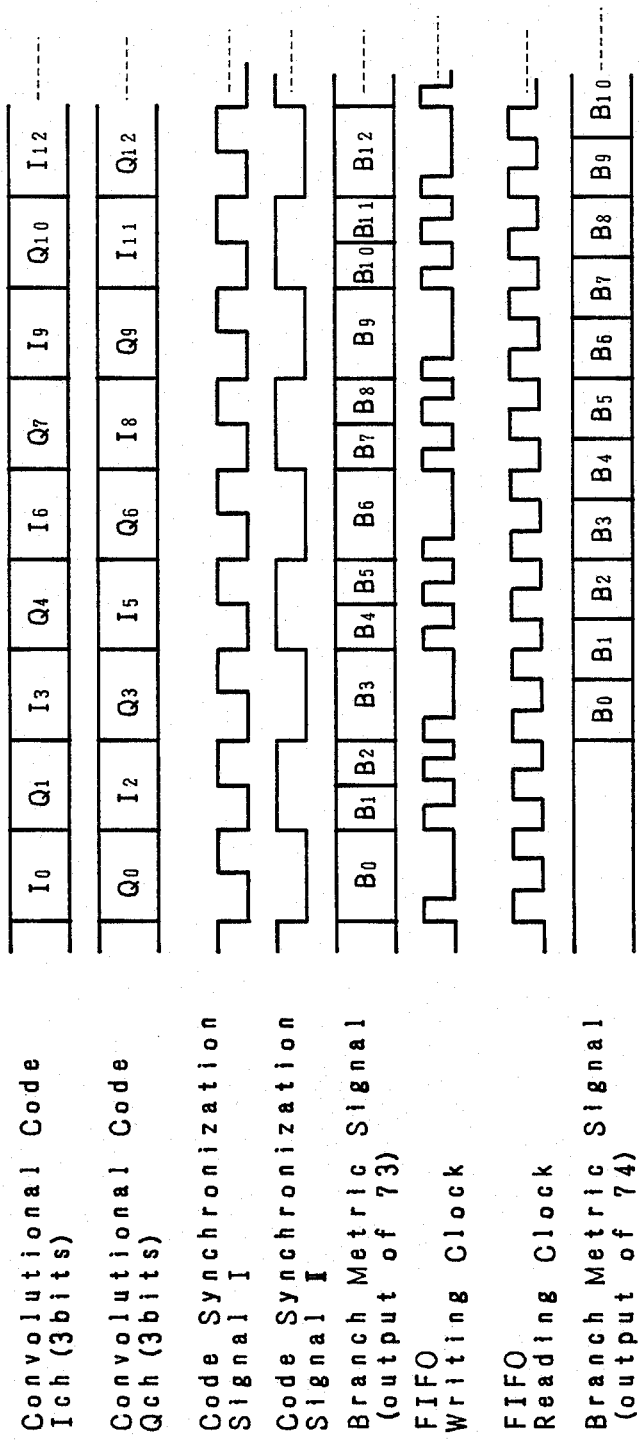
FIG. 5 is an operation time chart of the maximum likelihood decoder.

FIG. 5 shows an operation time chart of the above maximum likelihood decoder.

Convolutional codes of I and Q channels are inputted respectively at the input terminals 70, 71 while two code synchronization signals I, II are inputted at the input terminal 72. The cycle of the code synchronization signal I coincides with the cycle of transmission clocks on the channel 5 while the code synchronization signal II has the cycle twice as much as that of the code synchronization signal I.

A branch metric calculator 73 comprises, for instance, two ROMs 730 of 256 words × 8 bits, and two D flip flops 731 of 16 bits, and generates branch metric signals $B_{3n}$ in accordance with the code synchronization signal II when the input codes are $I_{3n}$ and $Q_{3n}$, and branch metric signals $B_{3n+1}$, $B_{3n+2}$ in accordance with the code synchronization signal I when the input codes are $Q_{3n+1}$, $I_{3n+2}$. These branch metric signals are the metrics of the received signals calculated in accordance with the state transition of the convolutional codes shown in FIG. 3 and assume the form of 16 bit signals composed with four 4-bit signal units.

A speed converter 74 converts the speed of the branch metric signals by using a FIFO memory 740. In other words, branch metric signals are written in the FIFO memory 740 at the output timing of the branch metric calculator 73, and are read out with the clock equivalent to the speed of the original data sequences. The read out branch metric signals are fed to a path metric calculator 75 via a D flip flop 741.

The path metric calculator 75, a path memory 76 and a decoder output decision circuit 77 process error correction decoding with Viterbi algorithm in a manner similar to the prior art maximum likelihood decoder, and output decoded data to an output terminal 9.

Figure 6:
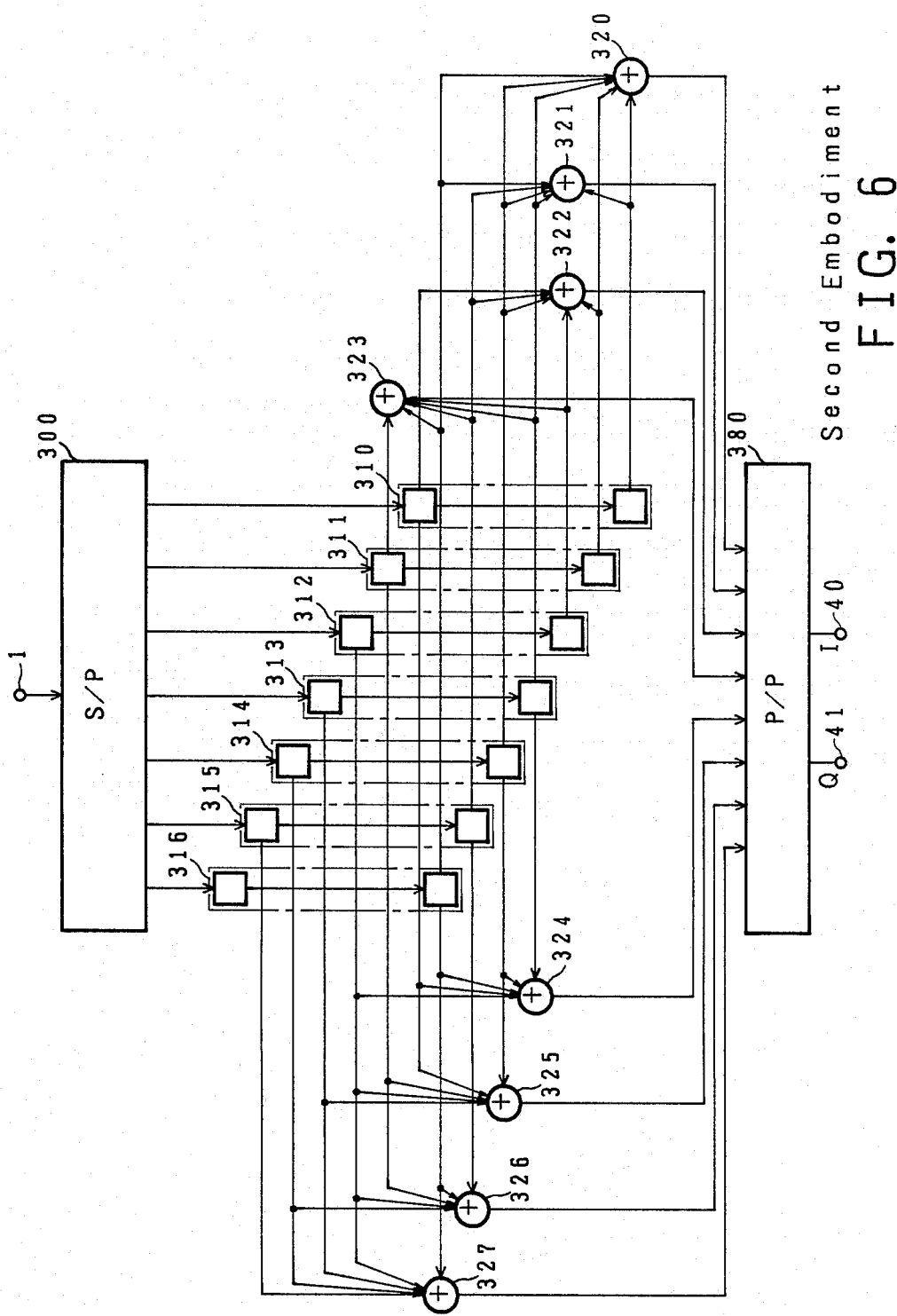
FIG. 6 is a block diagram of a convolutional encoder used in a second embodiment of this invention.

The second embodiment of this invention having a convolutional encoder 3 and a maximum likelihood decoder 7 corresponding thereto will now be described as having:

the coding rate of original convolutional codes:

$K_{0/n1} = 7/14 = \frac{1}{2}$, the constraint length: k=7, and
rate on the channel 5: $k_0/n_0 = \frac{7}{8}$ FIG. 6 is a block diagram of a convolutional encoder in the second embodiment of this invention which corresponds to the convolutional encoder shown in FIG. 12.

An input terminal 1 is connected to a serial/parallel converter 300 which distributes serial data sequences into 7 sequences to be outputted to shift registers of 2 bits, 310, 311, 312, 313, 314, 315 and 316.

The input of a modulo-2 adder 320 is connected to the second bit of shift registers 310, 311, 313, 314 and 316. The input of a modulo-2 adder 321 is connected to the second bit of shift registers 310, 313, 314, 315 and 316. The input of a modulo-2 adder 322 is connected to the second bit of shift registers 311, 312, 314 and 315 as well as to the first bit of the shift register 310. The input of a modulo-2 adder 323 is connected to the first bits of the shift registers 312, 313, 315 and 316 as well as to the first bit of the shift register 311.

The input of a modulo-2 adder 324 is connected to the second bits of shift registers 313, 314 and 316 as well as to the first bits of the shift registers 310 and 312. The input of a modulo-2 adder 325 is connected to the second bit of the shift register 314 as well as to the first bits of the shift registers 310, 311, 312 and 313. The input of a modulo-2 adder 326 is connected to the second bits of the shift registers 315 and 316 as well as to the first bits of the shift registers 311 312 and 314. The input of a modulo-2 adder 327 is connected to the second bit of the shift register 316 as well as the first bits of the shift registers 312, 313, 314 and 315.

The outputs from the modulo-2 adders 320 through 327 are connected to a parallel/parallel converter 380 which is connected to output terminals 40, 41.

The parallel/parallel converter 380 converts the outputs from the modulo-2 adders 320 through 327 in 8- 2 parallel to parallel. This causes the outputs from the modulo-2 adders 320, 322, 324, 326 to be sequentially outputted at the output terminal 40 as I channel codes. The outputs from the modulo-2 adders 321, 323, 325, 327 are outputted similarly at the output terminal 41 as Q channel codes.

Figure 12:
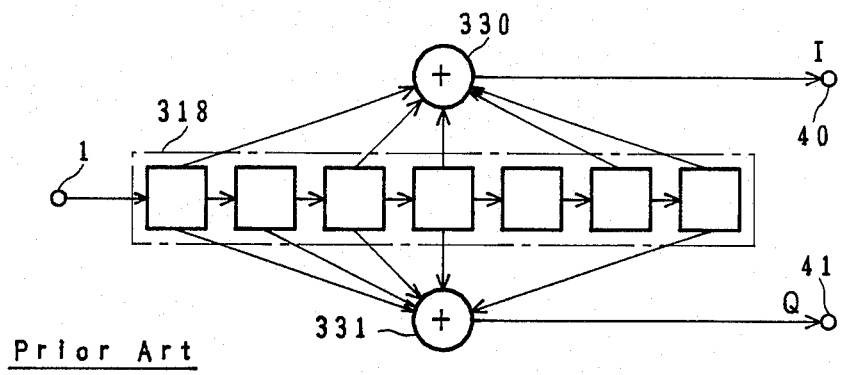
FIG. 12 is a block diagram of a third prior art convolutional encoder.
Figure 13:
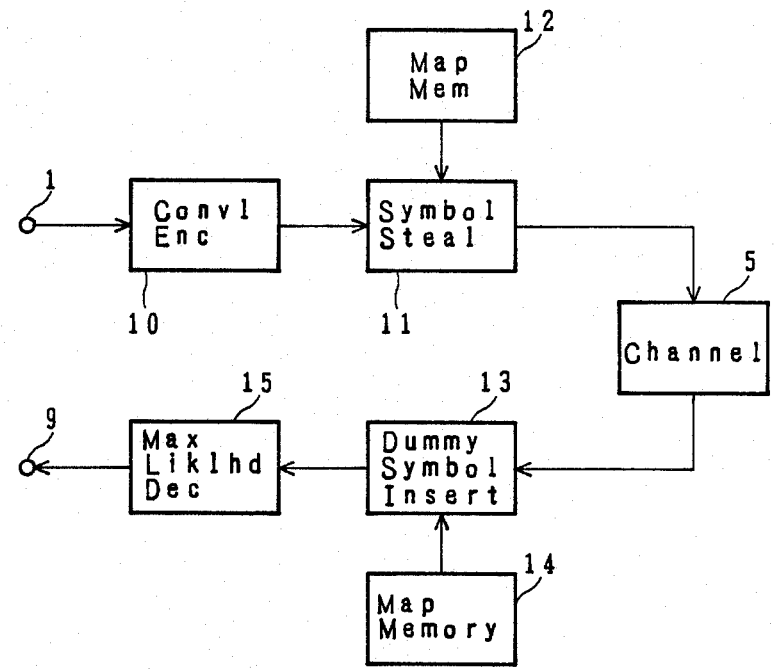
FIG. 13 is a block diagram of a prior art error correcting code encoder of the punctured method.
Figure 14:
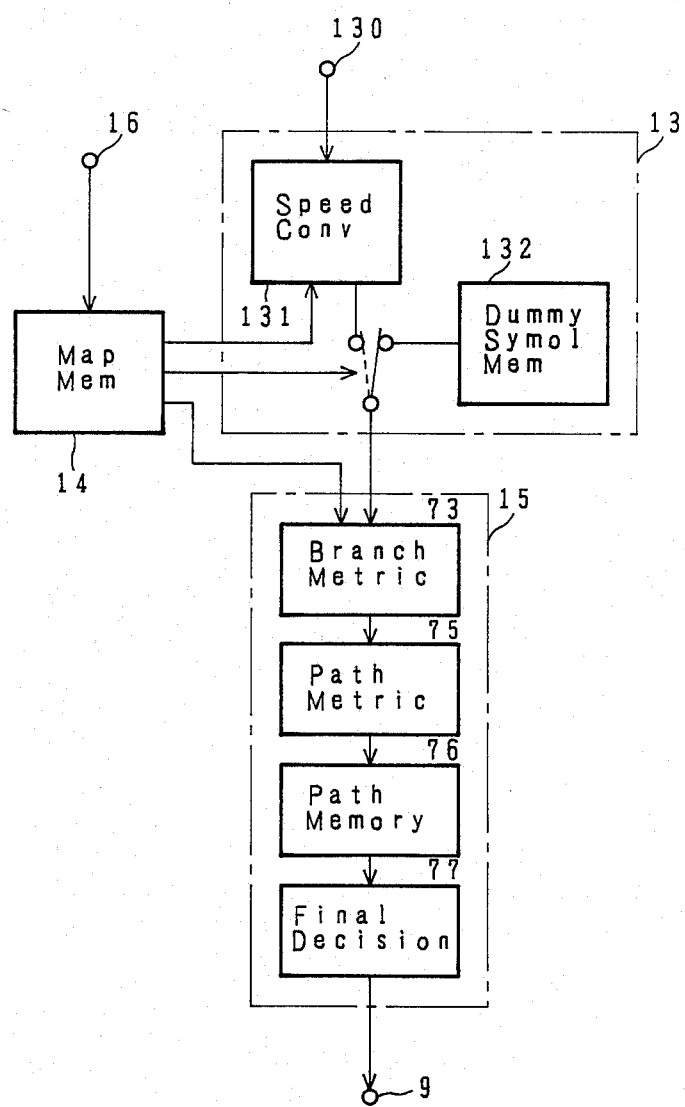
FIG. 14 is a block diagram of the receiver side in further detail.

If the I and Q channel codes outputted from the prior art convolutional encoder shown in FIG. 12 are expressed as below;

$I = (I_0, I_1, I_2, \ldots)$ $Q = (Q_0, Q_1, Q_2, \ldots)$ then, the I and Q channel codes outputted according to this invention will be;

$I = (\ldots, I_{7n}, I_{7n+1}, I_{7n+3}, I_{7n+5} \ldots)$ $Q = (\ldots, Q_{7n}, I_{7n+2}, Q_{7n+4}, Q_{7n+6} \ldots)$ The decoder corresponding to the above convolutional encoder may be realized with the structure similar to that of the maximum likelihood decoder shown in FIG. 4, provided that the path metric calculator 75, the path memory 76, and the decoder output decision circuit 77 for convolutional codes having the coding rate of $\frac{1}{2}$ and the constraint length of k=7 are used.

Figure 7:
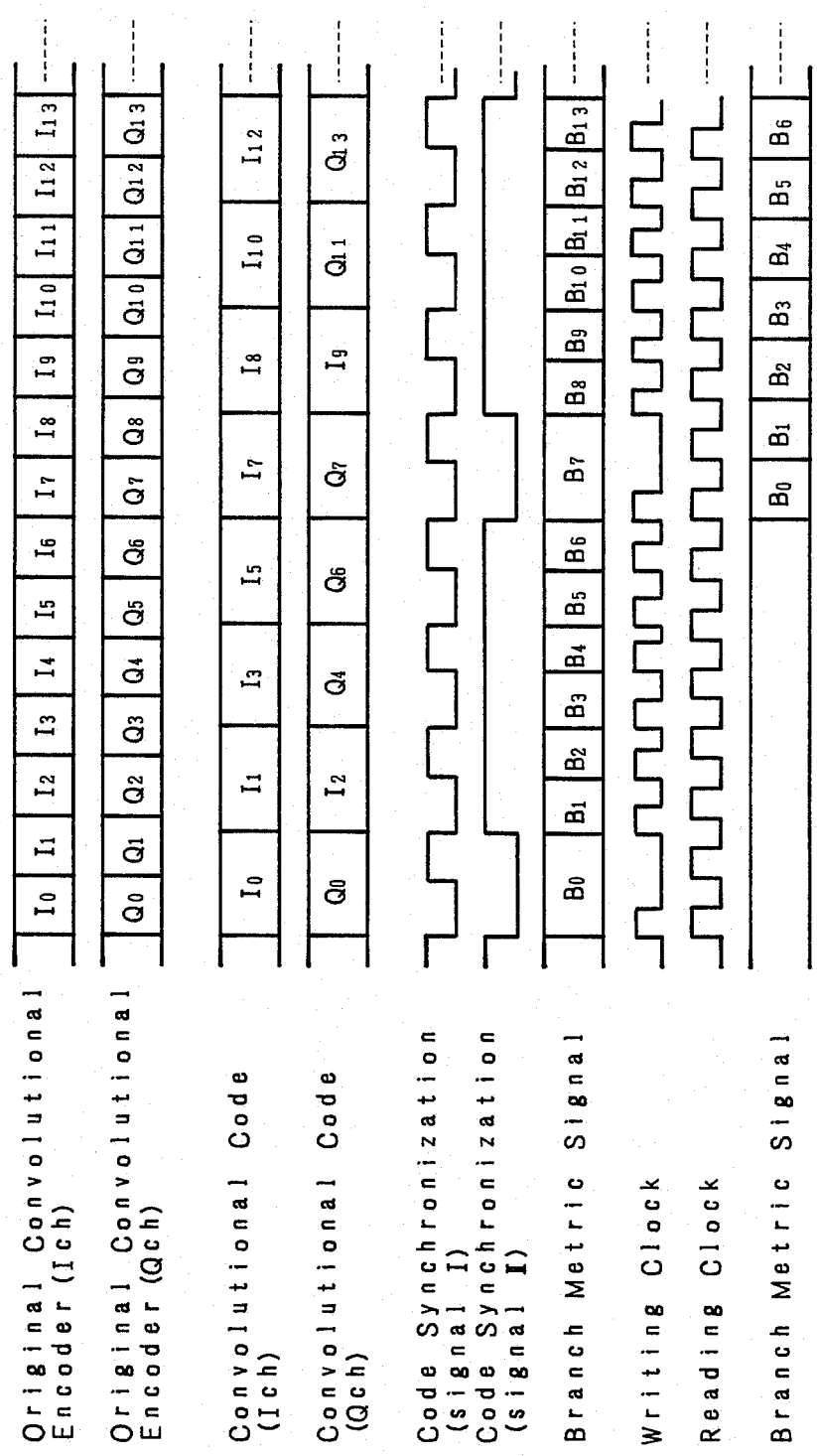
FIG. 7 is an operation time chart of the maximum likelihood decoder.
Figure 8:
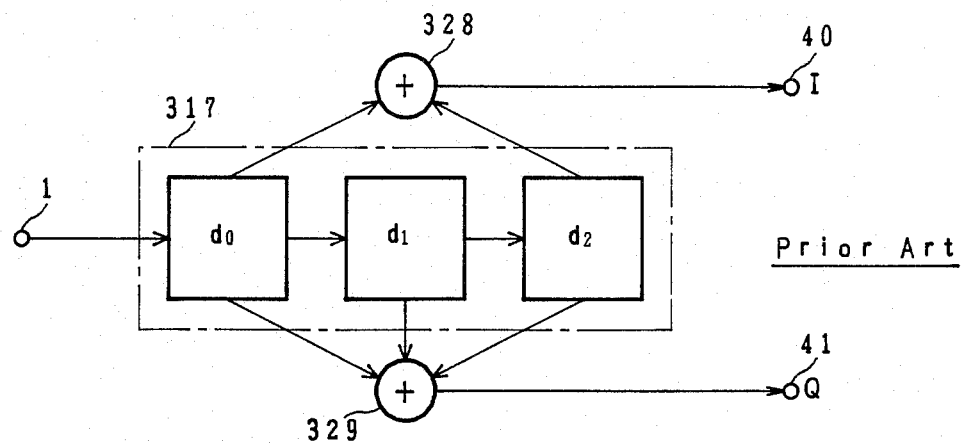
FIG. 8 is a block diagram of a prior art convolutional encoder.
Figure 9:
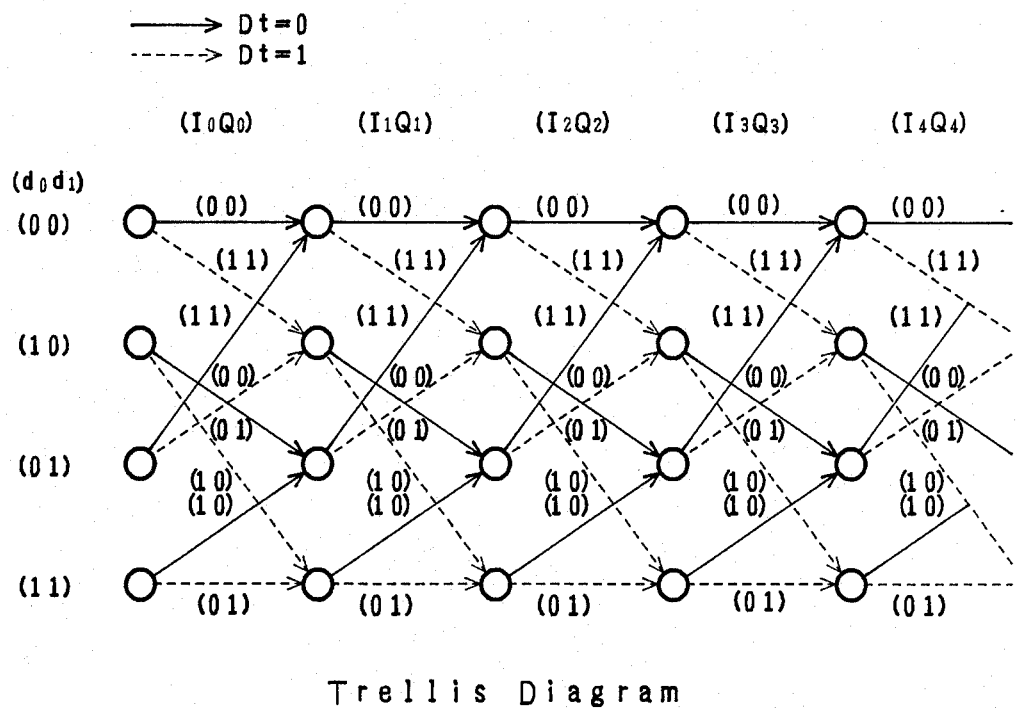
FIG. 9 is a trellis diagram of the convolutional encoder of FIG. 8.
Figure 10:
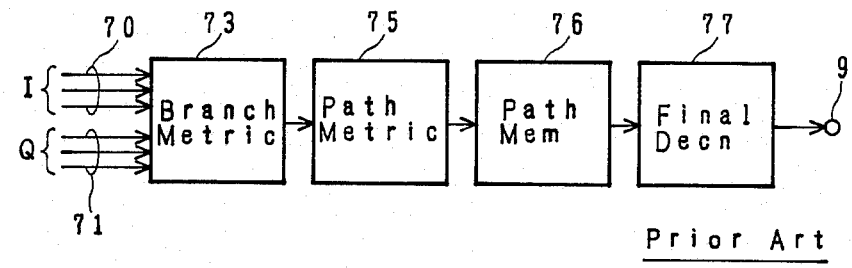
FIG. 10 is a block diagram which shows a first prior art Viterbi decoder.

FIG. 7 is an operation time chart of a maximum likelihood decoder used in the second embodiment. In FIG. 7, the code sequence gained by the prior art convolutional encoder shown in FIG. 12 is also written. The code synchronization signal II in this case are the signals which discriminate the codes having the common suffixes both in I and Q channels and can be formed from the signals having a cycle twice as much as the cycle of bit clock signals.

Figure 15:
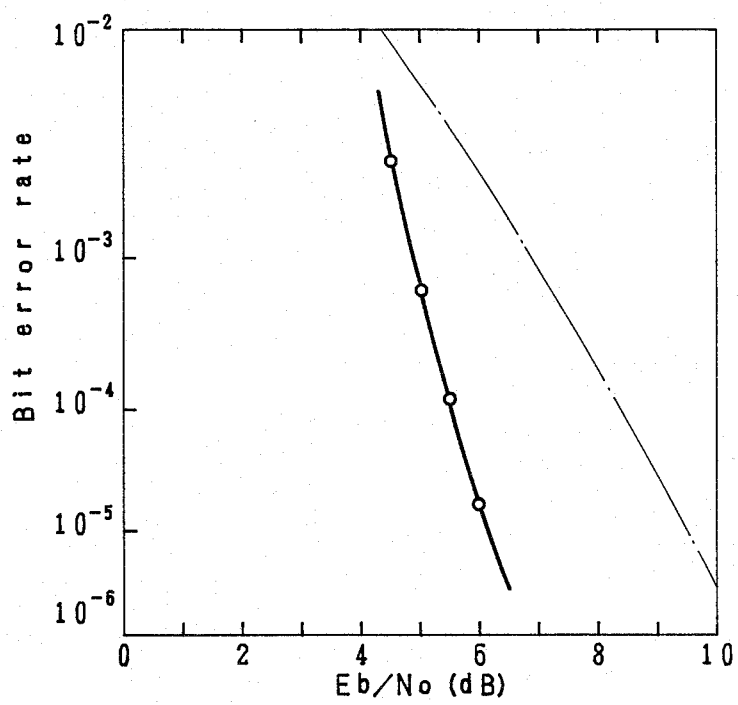
FIG. 15 is a graph to show characteristics demonstrated by an embodiment of this invention method.

FIG. 15 shows the characteristics of the second embodiment wherein the ratio of noise power against signal power per bit is plotted on the X axis while bit error rate is plotted on the Y axis. The dot-chain line denotes the performance without error correction while the solid line denotes the performance with this invention error correction. Black circles denote actually measured values according to this invention.

The original coding rate, the constraint length and the coding rate on the transmission channel are not necessarily limited to the above, but may be any arbitrary values to achieve the same effect. This invention can be realized by similar processing with software in a data processor unit.

As described in the foregoing, the error correcting encoder according to this invention can achieve the effect equal to the error correcting encoder of the punctured method, without the necessity of code symbol stealing, dummy bit insertion and complicated timing control. This invention method can therefore realize an error correcting encoder with a greater transmission efficiency and a higher coding path to achieve transmission of higher quality digital data in bands in a smaller number.

It should be appreciated that the above described description of the preferred embodiments do not limit the scope of the present invention in any way, and that various changes and modifications may be made without departing from the spirit and scope of the present invention.

What is claimed is:

1. A maximum likelihood decoder, used as an error correcting decoder provided for reception according to convolutional code and for estimating original data transmitted by calculating the metrics of received coded data, said maximum likelihood decoder comprising:
    branch metric calculator means for calculating branch metrics out of received encoded data of $n_O$ bits in the channel signal speed and for obtaining the branch metrics of the number $k_O$;
    speed converter means for converting the output from said branch metric calculator means into the signal speed of the original data; and
    estimating means for estimating original data in correspondence to the coding rate of $k_0/n_1$, $k_O$, $n_O$, $n_I$ being natural numbers having the relation $k_0 < n_0 < N_I$.

2. The error correcting decoder as claimed in claim 1 wherein said branch metric calculator means includes ROMs (Read Only Memories) which generate branch metrics from received channel signals in the channel signal speed and FIFOs (First In First Out memories) which convert the output of the branch metric calculator means ROMs into the signal speed of the original data.

3. A data transmission system comprising:
    maximum likelihood decoder means for estimating original data transmitted by calculating the metrics of received convolutional coded data, said maximum likelihood decoder means including:

branch metric calculator means for calculating branch metrics out of received encoded data of $n_O$ its in the channel signal speed and for obtaining the branch metrics of the number $k_O$;

speed converter means for converting the output from the branch metric calculator means into the signal speed of the original data; and means for estimating original data in corresponding to the coding rate of $k_O/n_I$, $k_O$, $n_O$, $n_I$ being natural numbers having the relation $k_0 < n_0 < n_1$; and error correcting encoder means provided for transmission including a convolutional encoder means for encoding input original data said convolutional encoder including generating means for generating convolutional codes of coding rate $k_O/n_O$ with a multinomial, predetermined terms of the generated multinomial being omitted.

4. The system as claimed in claim 3 wherein the branch metric calculator means includes ROMs (Read Only Memories) which generate branch metrics from received channel signals in the channel signal speed and FIFOs (First In First Out memories) which convert the output of the branch metric calculator means ROMs into the signal speed of the original data.

5. A data transmission system comprising:

maximum likelihood decoder means for estimating original data transmitted by calculating the metrics of received convolutional coded data, said maximum likelihood decoder means including:

branch metric calculator means for calculating branch metrics out of receive encoded data of $n_0$ bits in the channel signal speed for obtaining the branch metrics of the number $k_O$;

speed converter means for converting the output from the branch metric calculator means into the signal speed of the original data; and means for estimating original data in correspondence to the coding rate of $k_O/n_I$, $k_O$, $n_O$, $n_I$ being natural numbers having the relation $k_0 < n_0 < n_1$; and an error correcting encoder means provided for transmission and for encoding input original data by generating convolutional codes of coding rate $k_O/n_O$ with a multinomial, predetermined terms of the generated multinomial being omitted, said error correcting encoder means including:

a serial/parallel converter which distributes input original data sequence into sequences in the number of $k_O$;

shift registers in the number of $k_O$ which store the output from said serial/parallel converter; and modulo-2 adders in the number of $n_O$ which generate convolutional codes out of the data stored by said shift registers in correspondence to the generated multinomial of the convolutional codes.

6. The system as claimed in claim 5 wherein the branch metric calculator means includes ROMs (Read Only Memories) which generate branch metrics from received channel signals in the channel signal speed and FIFOs (First In First Out memories) which convert the output of the branch metric calculator means ROMs into the signal speed of the original data).

* * * * *